(12) United States Patent
Li et al.

(10) Patent No.: US 11,404,514 B2
(45) Date of Patent: Aug. 2, 2022

(54) DISPLAY DEVICE INCLUDING IRREGULARLY-SHAPED GATE DISPOSED BELOW DRIVING THIN-FILM TRANSISTOR

(71) Applicant: WUHAN CHINA STAR OPTOELECTRONICS SEMICONDUCTOR DISPLAY TECHNOLOGY CO., LTD., Hubei (CN)

(72) Inventors: Chao Li, Hubei (CN); Yonghui Zhang, Hubei (CN)

(73) Assignee: WUHAN CHINA STAR OPTOELECTRONICS SEMICONDUCTOR DISPAY TECHNOLOGY CO., LTD., Hubei (CN)

( * ) Notice: Subject to any disclaimer, the term of this patent is extended or adjusted under 35 U.S.C. 154(b) by 190 days.

(21) Appl. No.: 16/770,589

(22) PCT Filed: Jan. 9, 2020

(86) PCT No.: PCT/CN2020/071119
§ 371 (c)(1),
(2) Date: Jun. 5, 2020

(87) PCT Pub. No.: WO2021/077635
PCT Pub. Date: Apr. 29, 2021

(65) Prior Publication Data
US 2021/0408193 A1     Dec. 30, 2021

(30) Foreign Application Priority Data
Oct. 25, 2019   (CN) .......................... 201911024503.1

(51) Int. Cl.
     *H01L 29/08*     (2006.01)
     *H01L 27/32*     (2006.01)
     *H01L 29/423*     (2006.01)

(52) U.S. Cl.
     CPC ...... *H01L 27/3262* (2013.01); *H01L 27/3258* (2013.01); *H01L 29/42384* (2013.01)

(58) Field of Classification Search
     CPC ............ H01L 27/3262; H01L 27/3258; H01L 29/42384
(Continued)

(56) References Cited

U.S. PATENT DOCUMENTS

2015/0280169 A1*   10/2015   Choi .................... H01L 51/5237
                                                                                                        257/72
2018/0151612 A1*   5/2018   Zheng ............... H01L 27/14603
(Continued)

FOREIGN PATENT DOCUMENTS

CN       108597436 A     9/2018
CN       110164388 A     8/2019

*Primary Examiner* — Phuc T Dang
(74) *Attorney, Agent, or Firm* — Dickinson Wright PLLC

(57) ABSTRACT

A display device, including an irregularly-shaped display area disposed with a plurality of irregularly-shaped display pixels and at least one attachment device; and a pixel display area disposed adjacent to the irregularly-shaped display area; wherein each of the irregularly-shaped display pixels comprises an irregularly-shaped gate disposed below a driving thin-film transistor, and the irregularly-shaped gate changes a light-emitting brightness of the irregularly-shaped display pixel according to an adjustment voltage signal to balance light-emission uniformity of the irregularly-shaped display area and the pixel display area.

20 Claims, 4 Drawing Sheets

(58) Field of Classification Search
USPC .......................................................... 257/40
See application file for complete search history.

(56) References Cited

U.S. PATENT DOCUMENTS

2019/0103455 A1\* 4/2019 Song ................... H01L 27/3262
2019/0259345 A1   8/2019 Kohei
2020/0034100 A1\* 1/2020 Fan ..................... H01L 27/3288

\* cited by examiner

DISPLAY DEVICE INCLUDING IRREGULARLY-SHAPED GATE DISPOSED BELOW DRIVING THIN-FILM TRANSISTOR

FIELD OF INVENTION

The present disclosure relates to the field of display technologies, and more particularly, to a display device.

BACKGROUND OF INVENTION

Active-matrix organic light-emitting diode (AMOLED) display panels have gradually become a new-generation display technology due to features such as high contrast, wide color gamut, low power consumption, and foldability. In the field of mobile phone display, in order to increase screen ratio and area of a display area, an existing panel technology is designed with a combination of irregular regions, including cutting a U-shaped area 11 on a panel 1 to set a receiver or a front camera as shown in FIG. 1, or separating an O-shaped area 21 of a panel 2 to set a receiver, a front camera, or an under-screen camera as shown in FIG. 2.

However, during a data writing stage, due to a load difference between the irregular regions and the normal display area, actual voltages written into driving gates are different, which causes a problem of uneven light emission uniformity of the panel.

Therefore, there is a need to provide a new display device to solve the problems existing in the prior art.

SUMMARY OF INVENTION

In order to solve the above technical problems, the present disclosure provides a display device to balance light-emitting uniformity of the irregularly-shaped display area and the pixel display area.

To achieve the above object, the present disclosure provides a display device, including an irregularly-shaped display area disposed a plurality of irregularly-shaped display pixels and at least one attachment device; and a pixel display area disposed adjacent to the irregularly-shaped display area; wherein each the irregularly-shaped display pixel comprises an irregularly-shaped gate disposed below a driving thin-film transistor, and the irregularly-shaped gate changes a light-emitting brightness of the irregularly-shaped display pixel according to an adjustment voltage signal, to balance light-emitting uniformity of the irregularly-shaped display area and the pixel display area.

In an embodiment of the present disclosure, the irregularly-shaped display area is divided into a plurality of irregularly-shaped display pixel areas, the irregularly-shaped gates of all the irregularly-shaped display pixels of the same irregularly-shaped display pixel area are connected.

In an embodiment of the present disclosure, the irregularly-shaped display area is divided into a plurality of irregularly-shaped display pixel areas, the irregularly-shaped gates of a plurality of the irregularly-shaped display pixels of the same irregularly-shaped to display pixel area are connected.

In an embodiment of the present disclosure, the plurality of irregularly-shaped gates connected through a gate lead, and the irregularly-shaped display pixel area receives the adjustment voltage signal through the gate lead.

In an embodiment of the present disclosure, the irregularly-shaped gate is disposed between a buffer layer and a gate insulating layer of the irregularly-shaped display pixel.

In an embodiment of the present disclosure, a shape of the irregularly-shaped display area is a U-shaped or an O-shaped.

In an embodiment of the present disclosure, a constituent material of the irregularly-shaped gate includes metal, metal oxide, heavily doped silicon, or graphene.

In an embodiment of the present disclosure, the irregularly-shaped display area is divided into a plurality of irregularly-shaped display pixel areas, and each of the irregularly-shaped display pixel areas receives different adjustment voltage signal.

To achieve the above objects, the present disclosure provides a display device, including an irregularly-shaped display area disposed a plurality of irregularly-shaped display pixels and at least one attachment device, a shape of the irregularly-shaped display area is a U-shaped or an O-shaped; and a pixel display area disposed adjacent to the irregularly-shaped display area; wherein each the irregularly-shaped display pixel comprises an irregularly-shaped gate disposed below a driving thin-film transistor, and the irregularly-shaped gate changes a light-emitting brightness of the irregularly-shaped display pixel according to an adjustment voltage signal, to balance light-emitting uniformity of the irregularly-shaped display area and the pixel display area, the irregularly-shaped display area is divided into a plurality of irregularly-shaped display pixel areas, the irregularly-shaped gates of all the irregularly-shaped display pixels of the same irregularly-shaped display pixel area are connected.

In an embodiment of the present disclosure, a constituent material of the irregularly-shaped gate comprises metal, metal oxide, heavily doped silicon, or graphene.

In an embodiment of the present disclosure, the plurality of irregularly-shaped gates connected through a gate lead, and the irregularly-shaped display pixel area receives the adjustment voltage signal through the gate lead.

In an embodiment of the present disclosure, the irregularly-shaped gate is disposed between a buffer layer and a gate insulating layer of the irregularly-shaped display pixel.

In an embodiment of the present disclosure, the irregularly-shaped display area is divided into a plurality of irregularly-shaped display pixel areas, and each of the irregularly-shaped display pixel areas receives different adjustment voltage signal.

In an embodiment of the present disclosure, when the shape of the irregularly-shaped display area is the U-shaped, the attachment device is disposed in a recess of the U-shaped.

In an embodiment of the present disclosure, when the shape of the irregularly-shaped display area is the O-shape, the attachment device is disposed in a circle of the O-shaped.

In an embodiment of the present disclosure, the attachment device comprises a receiver, a front camera, an under-screen camera or other communication module.

In an embodiment of the present disclosure, the irregularly-shaped display area is disposed a plurality of the attachment devices, each of the attachment devices is a different device.

To achieve the above objects, the present disclosure further provides a display device, including:
an irregularly-shaped display area disposed a plurality of irregularly-shaped display pixels and an attachment device area disposed an attachment device, a shape of the irregularly-shaped display area is a U-shaped or an O-shaped; and a pixel display area disposed adjacent to the irregularly-shaped display area;

wherein each the irregularly-shaped display pixel comprises an irregularly-shaped gate disposed below a driving thin-film transistor, and the irregularly-shaped gate changes a light-emitting brightness of the irregularly-shaped display pixel according to an adjustment voltage signal, to balance light-emitting uniformity of the irregularly-shaped display area and the pixel display area wherein the irregularly-shaped display pixel comprises a first polyimide layer, a first buffer layer disposed on the first polyimide layer; a second polyimide layer disposed on the first buffer layer; a second buffer layer disposed on the second polyimide layer; the irregularly-shaped gate disposed on the second buffer layer; an initial gate insulating layer covering the irregularly-shaped gate; an active layer disposed on the initial gate insulating layer; a metal layer disposed on the active layer; a first gate insulating layer disposed on the initial gate insulating layer; a first gate insulating layer disposed on the first gate insulating layer; a second gate insulating layer covering the first gate metal layer; a second gate metal layer disposed on the second gate insulating layer; a spacer layer disposed on the second gate metal layer; a planarization film disposed on the spacer layer and a pixel definition layer covering an anode.

In an embodiment of the present disclosure, the irregularly-shaped gate is disposed between the first buffer layer and the gate insulating layer or a second buffer layer and the gate insulating layer of the irregularly-shaped display pixel.

In an embodiment of the present disclosure, the irregularly-shaped display area is divided into a plurality of irregularly-shaped display pixel areas, the irregularly-shaped gates of a plurality of the irregularly-shaped display pixels of the same irregularly-shaped display pixel area are electrically connected.

A display device provided by the present disclosure includes an irregularly-shaped display area disposed with a plurality of irregularly-shaped display pixels and at least one attachment device, and a pixel display area disposed adjacent to the irregularly-shaped display area; wherein each of the irregularly-shaped display pixels comprises an irregularly-shaped gate disposed below a driving thin-film transistor, and the irregularly-shaped gate changes a light-emitting brightness of the irregularly-shaped display pixel according to an adjustment voltage signal, thereby achieving an effect of balancing light emission uniformity of the irregularly-shaped display area and the pixel display area.

In order to make the above contents of the present disclosure more comprehensible, the following describes the preferred embodiments in detail with the accompanying figures as follows:

DETAILED DESCRIPTION OF PREFERRED EMBODIMENTS

Figure 1:
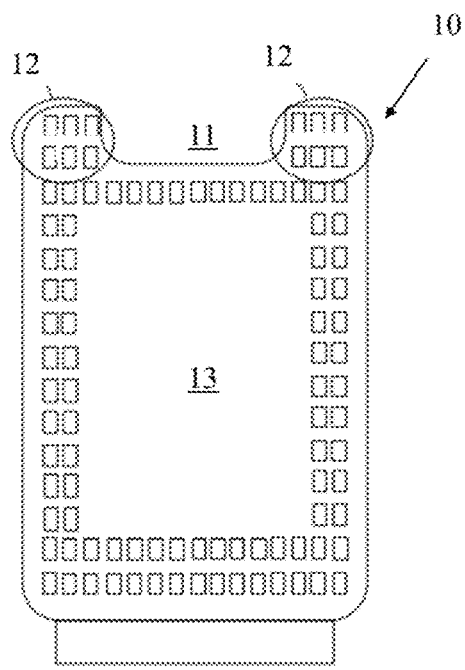
FIG. 1 shows a schematic diagram of a display device of the prior art.
Figure 2:
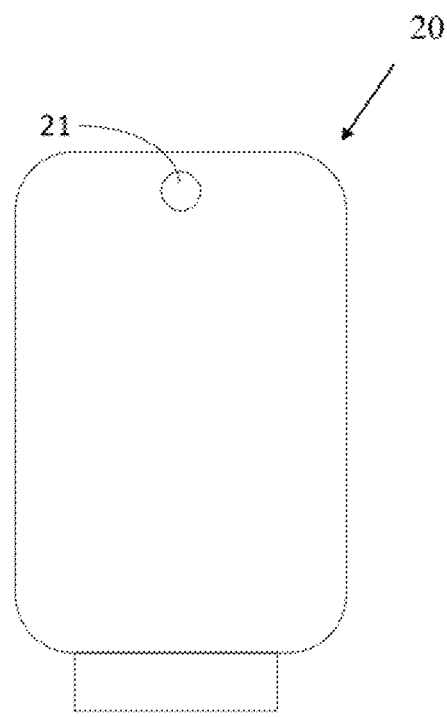
FIG. 2 shows a schematic diagram of a display device of the prior art.

The following embodiments of the present disclosure are described with reference to the accompanying figures to illustrate specific embodiments that can be implemented. The directional terms mentioned in the present disclosure, such as up, down, front, rear, left, right, top, bottom, etc., are only for reference to the direction of additional figures. Therefore, the directional terms used are for explaining and understanding, and not for limiting the present disclosure.

In the figure, similarly structured units are denoted by the same reference numerals.

Figure 3:
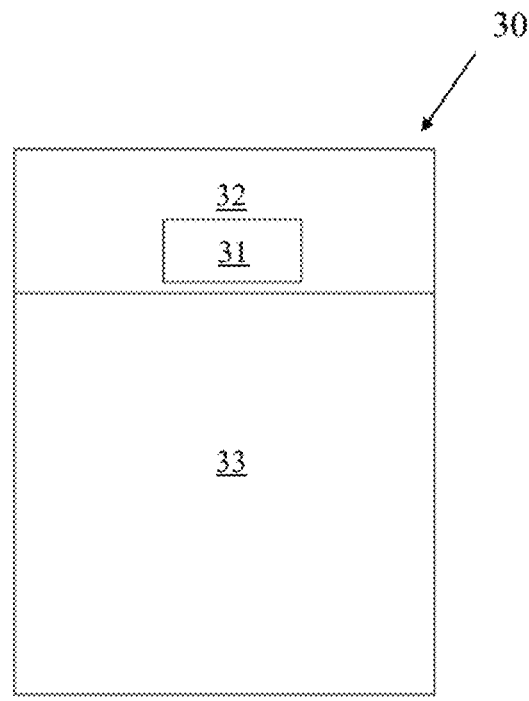
FIG. 3 shows a block diagram of a display device according to an embodiment of the present disclosure.
Figure 4:
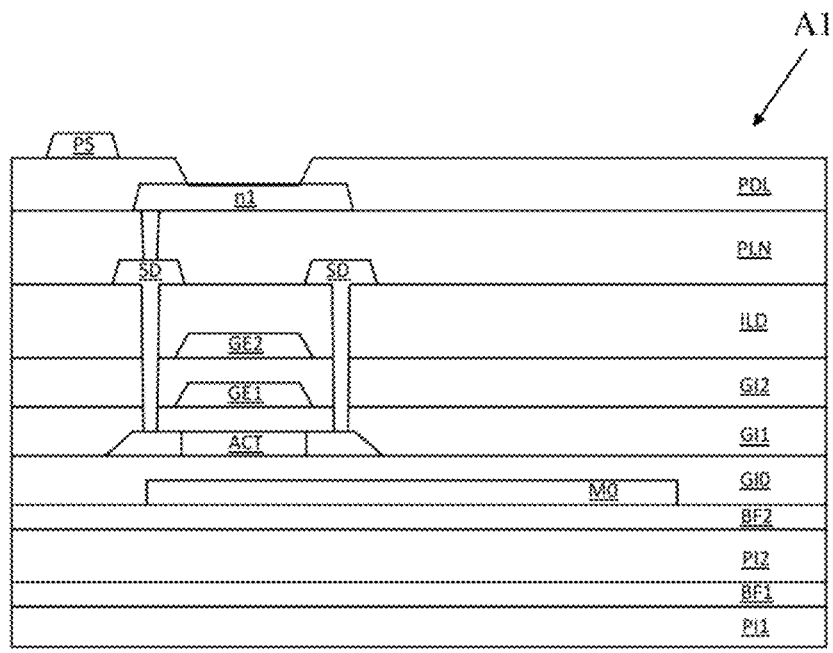
FIG. 4 shows a schematic block diagram of an irregularly-shaped display pixel according to an embodiment of the disclosure.

Please refer to FIG. 3 and FIG. 4, FIG. 3 shows a block diagram of a display device according to an embodiment of the present disclosure, FIG. 4 shows a schematic block diagram of an irregularly-shaped display pixel according to an embodiment of the disclosure. A display device 30 includes an irregularly-shaped display area 32 disposed with an attachment device 31 and a plurality of irregularly-shaped display pixels A1 (disclosed in FIG. 4); and a pixel display area 33 disposed adjacent to the irregularly-shaped display area 32, wherein each of the irregularly-shaped display pixels A1 includes an irregularly-shaped gate MO disposed below a driving thin-film transistor, and the irregularly-shaped gate MO changes a light-emitting brightness of the irregularly-shaped display pixel A1 according to an adjustment voltage signal, thereby balancing a light-emitting uniformity of the irregularly-shaped display area 32 and the pixel display area 33.

The attachment device 31 includes attachment devices such as a receiver, a front camera, an under-screen camera, or other communication modules.

In an embodiment of the present disclosure, the irregularly-shaped display area 32 is disposed with a plurality of attachment devices 31, and each of the attachment devices 31 may be a different device.

The display device of the present disclosure may also include other aspects. For example, a shape of the irregularly-shaped display area 32 is a U-shape, and the attachment device 31 is disposed in a recess of the U-shape; or, a shape of the irregularly-shaped display area 32 is an O-shape, and the attachment device 31 is disposed in a circle of the O-shape.

Please further refer to FIG. 4. FIG. 4 shows a schematic block diagram of an irregularly-shaped display pixel according to an embodiment of the disclosure. An irregularly-shaped display pixel A1 includes a first polyimide (P1) layer P11, a first buffer layer BF1 disposed on the first polyimide (P1) layer P11, a second polyimide layer P12 disposed on the first buffer layer BF1, a second buffer layer BF2 disposed on the second polyimide layer P12, the irregularly-shaped gate MO disposed on the second buffer layer BF2, an initial gate insulating layer GI0 disposed to cover the irregularly-shaped gate MO, an active layer ACT disposed on the initial gate insulating layer GI0, a metal layer SD disposed on the active layer ACT, a first gate insulating layer GI1 disposed on the initial gate insulating layer GI0, a first gate metal layer GE1 disposed on the first gate insulating layer GI1, a second gate insulating layer GI2 disposed to cover the first gate insulating layer GI1, a second gate metal layer GE2 disposed on the second gate insulating layer GI2, a spacer layer ILD disposed on the second gate metal layer GE2, a planarization film PLN disposed on the spacer layer ILD, and a pixel definition layer PDL disposed to cover an anode n1. In other words, the irregularly-shaped gate MO is disposed below the driving thin film transistor.

In an embodiment of the present disclosure, the irregularly-shaped gate MO is disposed between the buffer layer and the gate insulating layer of the irregularly-shaped display pixel A1.

In detail, by regulating a voltage of the irregularly-shaped gate MO and changing a threshold voltage of the driving transistor, an effect of controlling the light-emitting brightness of the irregularly-shaped display pixel A1 is achieved, wherein a constituent material of the irregularly-shaped gate MO includes metal, metal oxide, heavily doped silicon, or graphene.

In an embodiment of the present disclosure, when no pixel is disposed in an area disposed with the attachment device 31, the irregularly-shaped gate stage MO extends to the area disposed with the attachment device 31, and by applying a corresponding voltage to the irregularly-shaped gate MO, a load of the irregularly-shaped display area 32 is changed to achieve the effect of improving light emission uniformity.

In an embodiment of the present disclosure, the irregularly-shaped display area 32 is divided into a plurality of irregularly-shaped display pixel areas. The irregularly-shaped gates of all of the irregularly-shaped display pixels of a same irregularly-shaped display pixel area are connected. The corresponding voltage is applied to the irregularly-shaped gate MO to change the load of the irregularly-shaped display pixel area and achieve the effect of improving the uniformity of light emission.

Figure 5:
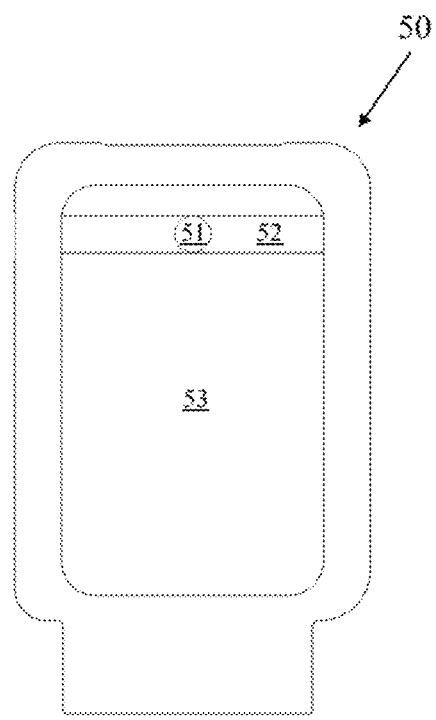
FIG. 5 shows a schematic block diagram of a display device according to an embodiment of the present disclosure.

For further explanation, please refer to FIG. 5, FIG. 5 shows a schematic block diagram of a display device according to an embodiment of the present disclosure. The display device 50 includes an irregularly-shaped display area 52, a digging area 51 disposed in the irregularly-shaped display area 52, and a pixel display area 53. The digging area 51 is disposed with an attachment device and no pixel is provided. Since the digging area 51 has no pixels, this causes the load of the irregularly-shaped display area 52 and the pixel display area 53 in the display device 50 be different. Therefore, by extending the irregularly-shaped gate stage MO into the digging area 51 and applying a corresponding voltage through the irregularly-shaped gate MO, the load of the irregularly-shaped display region 52 is changed to achieve the effect of improving the uniformity of light emission.

In an embodiment of the present disclosure, the irregularly-shaped gates of all of the irregularly-shaped display pixels A1 of the same irregularly-shaped display pixel area are connected. However, the embodiments of the present disclosure are not limited to this, for example, the irregularly-shaped gates of the plurality of irregularly-shaped display pixels A1 of the same irregularly-shaped display pixel area are connected, thereby achieving a regional change in light emission brightness of the plurality of irregularly-shaped display pixels A1.

Figure 6:
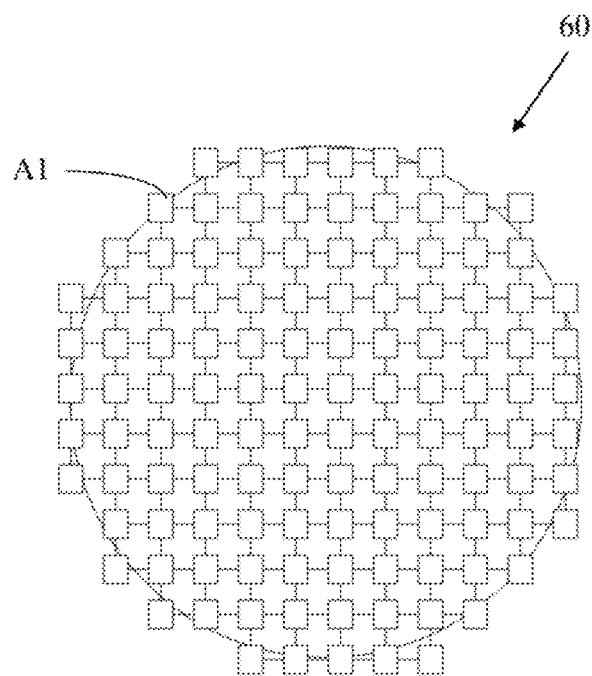
FIG. 6 shows a block diagram of an attachment device area according to an embodiment of the disclosure.

For further explanation, please refer to FIG. 6, which shows a schematic diagram illustrating a top view of a setting area of an irregularly-shaped display pixel area 60 according to an embodiment of the present disclosure. In the embodiment of FIG. 6, the irregularly-shaped display pixel area 60 is provided with both the irregularly-shaped display pixels and an additional device such as an under-screen camera, wherein the irregularly-shaped display pixel area 60 is disposed with a plurality of irregularly-shaped display pixels A1 which connect the corresponding irregularly-shaped gates. In order to ensure that there is more light received, the pixels are sparsely arranged. By adding the irregularly-shaped gate MO layer and applying corresponding voltages through the leads, the threshold voltage in this area is changed and the effect of improving the uniformity of light emission is achieved.

In an embodiment of the present disclosure, an irregularly-shaped display area is divided into a plurality of irregularly-shaped display pixel areas, and each of the irregularly-shaped display pixel areas receives a different adjustment voltage signal.

In an embodiment of the present disclosure, an irregularly-shaped display area is divided into a plurality of irregularly-shaped display pixel areas, and irregularly-shaped gates of all irregularly-shaped display pixels of a same irregularly-shaped display pixel area are connected.

In an embodiment of the present disclosure, the irregularly-shaped display area is divided into a plurality of irregularly-shaped display pixel areas, and irregularly-shaped gates of a plurality of irregularly-shaped display pixels of a same irregularly-shaped display pixel area are connected.

In an embodiment of the present disclosure, the plurality of irregularly-shaped gates are connected through a gate lead.

In an embodiment of the present disclosure, the irregularly-shaped display pixel area receives the adjustment voltage signal through the gate lead.

In an embodiment of the present disclosure, a shape of the irregularly-shaped display area is a U-shape or an O-shape.

In an embodiment of the present disclosure, a constituent material of an irregularly-shaped gate comprises metal, metal oxide, heavily doped silicon, or graphene.

In an embodiment of the present disclosure, an irregularly-shaped display area is divided into a plurality of irregularly-shaped display pixel areas, and each of the irregularly-shaped display pixel areas receives a different adjustment voltage signal.

Figure 7:
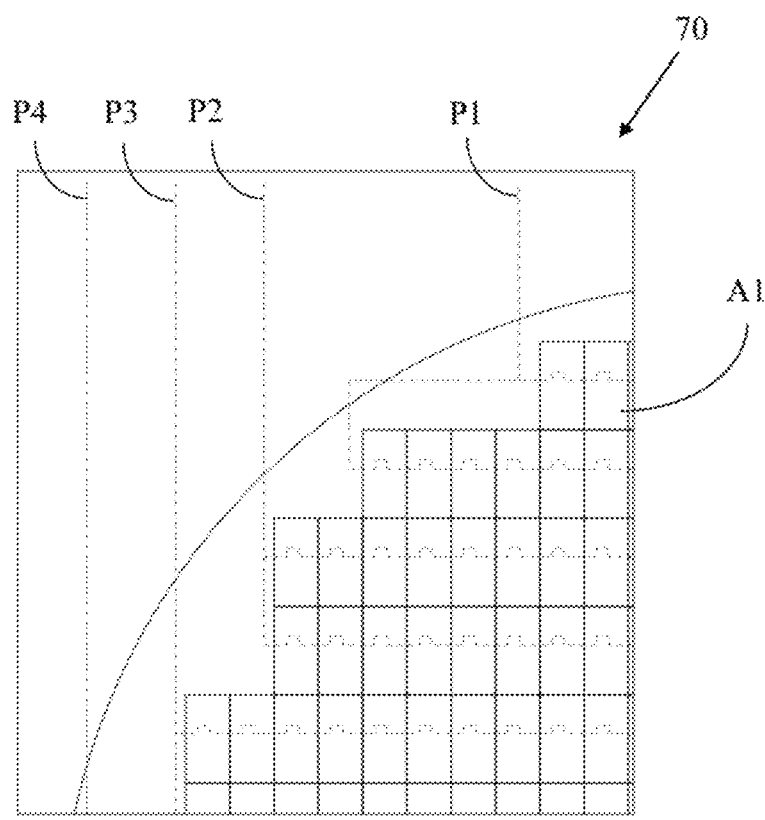
FIG. 7 shows a block diagram of a part of the irregularly-shaped display area according to an embodiment of the present disclosure.

Please further refer to FIG. 7, which shows a block diagram of a part of an irregularly-shaped display area according to an embodiment of the present disclosure, wherein in the part of the irregularly-shaped display area 70, a gate voltage is different due to a varying position of the irregularly-shaped area. In the embodiment shown in FIG. 7 the behavior classification rule is adopted, in which several rows of irregularly-shaped display pixels A1 are a group forming an irregularly-shaped display pixel area. As shown in the figure, the irregularly-shaped display pixels A1 in first and second rows constitute a first irregularly-shaped display pixel area P1 which receives a first adjustment voltage signal, the irregularly-shaped display pixels A1 in third and fourth rows constitute a second irregularly-shaped display pixel area P2 which receives a second adjustment voltage signal, the irregularly-shaped display pixels A1 in fifth and sixth rows constitute a third irregularly-shaped display pixel area P3 which receives a third adjustment voltage signal, and the irregularly-shaped display pixels A1 in seventh and eighth rows constitute a fourth irregularly-shaped display pixel area P4 which receives a fourth adjustment voltage signal; wherein the first adjustment voltage signal, the second adjustment voltage signal, the third adjustment voltage signal, and the fourth adjustment voltage signal are different. The first irregularly-shaped display pixel area P1, the second irregularly-shaped display pixel area P2, the third irregularly-shaped display pixel area P3, and the fourth irregularly-shaped display pixel area P4 can be set to receive an adjustment voltage signal through a lead.

Since the display device provided by the present disclosure includes an attachment device area disposed with an attachment device; an irregularly-shaped display area disposed adjacent to the attachment device area; and a pixel display area disposed adjacent to the irregularly-shaped display area, wherein the irregularly-shaped display area is disposed with a plurality of irregularly-shaped display pixels, each the irregularly-shaped display pixels includes an irregularly-shaped gate disposed below a driving thin-film transistor, and the irregularly-shaped gate changes a light-emitting brightness of the irregularly-shaped display pixel according to an adjustment voltage signal, an effect of balancing light-emission uniformity of the irregularly-shaped display area and the pixel display area is achieved.

The above are only the preferred embodiments of the present disclosure. It should be noted that, for those of ordinary skill in the art, without departing from the principles of the present disclosure, several improvements and retouches can be made, and these improvements and retouches should also be regarded in the protected range of the present disclosure.

What is claimed is:

1. A display device, comprising:
an irregularly-shaped display area disposed with a plurality of irregularly-shaped display pixels and at least one attachment device; and
a pixel display area disposed adjacent to the irregularly-shaped display area;
wherein each of the irregularly-shaped display pixels comprises an irregularly-shaped gate disposed below a driving thin-film transistor, and the irregularly-shaped gate changes a light-emitting brightness of the irregularly-shaped display pixel according to an adjustment voltage signal to balance light-emission uniformity of the irregularly-shaped display area and the pixel display area.

2. The display device as claimed in claim 1, wherein the irregularly-shaped display area is divided into a plurality of irregularly-shaped display pixel areas, and irregularly-shaped gates of all of the irregularly-shaped display pixels of a same irregularly-shaped display pixel area are connected.

3. The display device as claimed in claim 1, wherein the irregularly-shaped display area is divided into a plurality of irregularly-shaped display pixel areas, and irregularly-shaped gates of the plurality of irregularly-shaped display pixels of a same irregularly-shaped display pixel area are connected.

4. The display device as claimed in claim 2, wherein the plurality of irregularly-shaped gates connect through a gate lead, and the irregularly-shaped display pixel areas receive the adjustment voltage signal through the gate lead.

5. The display device as claimed in claim 1, wherein the irregularly-shaped gate is disposed between a buffer layer and a gate insulating layer of the irregularly-shaped display pixel.

6. The display device as claimed in claim 1, wherein a shape of the irregularly-shaped display area is a U-shape or an O-shape.

7. The display device as claimed in claim 1, wherein a constituent material of the irregularly-shaped gate comprises metal, metal oxide, heavily doped silicon, or graphene.

8. The display device as claimed in claim 1, wherein the irregularly-shaped display area is divided into a plurality of irregularly-shaped display pixel areas, and each of the irregularly-shaped display pixel areas receives a different adjustment voltage signal.

9. A display device, comprising:
an irregularly-shaped display area disposed with a plurality of irregularly-shaped display pixels and an attachment device area disposed with an attachment device, a shape of the irregularly-shaped display area is a U-shape or an O-shape; and
a pixel display area disposed adjacent to the irregularly-shaped display area;
wherein each of the irregularly-shaped display pixels comprises an irregularly-shaped gate disposed below a driving thin-film transistor, the irregularly-shaped gate changes a light-emitting brightness of the irregularly-shaped display pixel according to an adjustment voltage signal to balance light-emission uniformity of the irregularly-shaped display area and the pixel display area, the irregularly-shaped display area is divided into a plurality of irregularly-shaped display pixel areas, and irregularly-shaped gates of all of the irregularly-shaped display pixels of a same irregularly-shaped display pixel area are connected.

10. The display device as claimed in claim 9, wherein a constituent material of the irregularly-shaped gate comprises metal, metal oxide, heavily doped silicon, or graphene.

11. The display device as claimed in claim 9, wherein the plurality of irregularly-shaped gates connect through a gate lead, and the irregularly-shaped display pixel areas receive the adjustment voltage signal through the gate lead.

12. The display device as claimed in claim 9, wherein the irregularly-shaped gate is disposed between a buffer layer and a gate insulating layer of the irregularly-shaped display pixel.

13. The display device as claimed in claim 9, wherein the irregularly-shaped display area is divided into the plurality of irregularly-shaped display pixel areas, and each of the irregularly-shaped display pixel areas receives a different adjustment voltage signal.

14. The display device as claimed in claim 9, wherein when the shape of the irregularly-shaped display area is the U-shape, the attachment device is disposed in a recess of the U-shape.

15. The display device as claimed in claim 9, wherein when the shape of the irregularly-shaped display area is the O-shape, the attachment device is disposed in a circle of the O-shape.

16. The display device as claimed in claim 9, wherein the attachment device comprises a receiver, a front camera, an under-screen camera, or other communication modules.

17. The display device as claimed in claim 16, wherein the irregularly-shaped display area is disposed with a plurality of attachment devices, and each of the attachment devices is a different device.

18. A display device, comprising:
an irregularly-shaped display area disposed with a plurality of irregularly-shaped display pixels and at least one attachment device; and
a pixel display area disposed adjacent to the irregularly-shaped display area;
wherein each of the irregularly-shaped display pixels comprises an irregularly-shaped gate disposed below a driving thin-film transistor, and the irregularly-shaped gate changes a light-emitting brightness of the irregularly-shaped display pixel according to an adjustment voltage signal to balance light-emission uniformity of the irregularly-shaped display area and the pixel display area; and wherein the irregularly-shaped display pixel comprises a first polyimide layer, a first buffer layer disposed on the first polyimide layer, a second polyimide layer disposed on the first buffer layer, a second buffer layer disposed on the second polyimide layer, the irregularly-shaped gate disposed on the second buffer layer, an initial gate insulating layer covering the irregularly-shaped gate, an active layer disposed on the initial gate insulating layer, a metal layer disposed on the active layer, a first gate insulating layer disposed on the initial gate insulating layer, a first gate metal layer disposed on the first gate insulating layer, a second gate insulating layer covering the first gate metal layer, a second gate metal layer disposed on the second gate insulating layer, a spacer layer disposed on the second gate metal layer, a planarization film disposed on the spacer layer, and a pixel definition layer covering an anode.

19. The display device as claimed in claim 18, wherein a constituent material of the irregularly-shaped gate comprises metal, metal oxide, heavily doped silicon, or graphene.

20. The display device as claimed in claim 18, wherein the irregularly-shaped display area is divided into a plurality of irregularly-shaped display pixel areas, and irregularly-shaped gates of the plurality of irregularly-shaped display pixels of a same irregularly-shaped display pixel area are electrically connected.

* * * * *